United States Patent
Rittenhouse et al.

(10) Patent No.: US 6,377,136 B1
(45) Date of Patent: Apr. 23, 2002

(54) THIN FILM RESONATOR FILTER HAVING AT LEAST ONE COMPONENT WITH DIFFERENT RESONANT FREQUENCY SETS OR ELECTRODE CAPACITANCE

(75) Inventors: George E. Rittenhouse, Holmdel; Michael George Zierdt, Belle Mead, both of NJ (US)

(73) Assignee: Agere Systems Guardian Corporation, Orlando, FL (US)

( * ) Notice: Subject to any disclaimer, the term of this patent is extended or adjusted under 35 U.S.C. 154(b) by 0 days.

(21) Appl. No.: 09/497,860

(22) Filed: Feb. 4, 2000

(51) Int. Cl.⁷ .................................................. H03H 9/54
(52) U.S. Cl. ...................... 333/188; 333/189; 310/312
(58) Field of Search ................................. 333/186–196; 310/311, 312, 324, 366

(56) References Cited

U.S. PATENT DOCUMENTS

| | | | |
|---|---|---|---|
| 4,502,932 A | 3/1985 | Kline et al. ............ 204/192 EC |
| 4,556,812 A | 12/1985 | Kline et al. .................. 310/324 |
| 4,719,383 A | 1/1988 | Wang et al. ................. 310/324 |
| 4,890,370 A | 1/1990 | Fukuda et al. .............. 29/25.35 |
| 4,988,957 A | 1/1991 | Thompson et al. ..... 331/107 A |
| 5,075,641 A | 12/1991 | Weber et al. ........... 331/108 C |
| 5,166,646 A | 11/1992 | Avanic et al. .......... 331/107 A |
| 5,231,327 A | * 7/1993 | Ketcham ................ 333/189 X |
| 5,232,571 A | 8/1993 | Braymen ................ 204/192.22 |
| 5,263,259 A | 11/1993 | Cimador ...................... 33/41.4 |
| 5,283,458 A | 2/1994 | Stokes et al. ................ 257/416 |
| 5,294,898 A | 3/1994 | Dworsky et al. ............ 333/187 |
| 5,303,457 A | 4/1994 | Falkner, Jr. et al. ....... 29/25.35 |
| 5,334,960 A | 8/1994 | Penunuri .................... 333/193 |
| 5,348,617 A | 9/1994 | Braymen ..................... 156/644 |
| 5,367,308 A | 11/1994 | Weber ................. 343/700 MS |
| 5,373,268 A | 12/1994 | Dworsky et al. ............ 333/187 |
| 5,381,385 A | 1/1995 | Greenstein ................... 367/140 |
| 5,403,701 A | 4/1995 | Lum et al. ................... 430/315 |
| 5,404,628 A | 4/1995 | Ketcham ................... 29/25.35 |
| 5,438,554 A | 8/1995 | Seyed-Bolorforosh et al. ....... 367/140 |
| 5,446,306 A | 8/1995 | Stokes et al. ................ 257/416 |
| 5,552,655 A | 9/1996 | Stokes et al. ................ 310/330 |

(List continued on next page.)

FOREIGN PATENT DOCUMENTS

JP            10-242799          *  9/1998

*Primary Examiner*—Robert Pascal
*Assistant Examiner*—Barbara Summons

(57) ABSTRACT

A thin film resonator (TFR) filter circuit including a plurality of TFRs connected in a series-shunt or shunt-series arrangement between input and output ports of the filter. A method is provided that allows for the shifting of resonant frequency sets in each TFR in respective series arms and shunt legs of the TFR filter circuit, as opposed to a conventional concatenating approach using a plurality of chained-up building blocks of TFRs, where resonant frequency sets in each of the series arms are equal, and where resonant frequency sets in each of the shunt legs are equal. Additionally, each TFR in the filter may have a unique parallel plate electrode capacitance, as opposed to the conventional concatenating approach where all series arm electrodes in the root filter design have equal capacitance, and where all shunt leg electrodes have equal capacitance. By shifting the resonant frequency sets and/or varying the electrode capacitance of the TFRs, a wider passband width may be achieved for a given return loss performance, as compared to conventionally designed filter circuits.

24 Claims, 8 Drawing Sheets

U.S. PATENT DOCUMENTS

| | | | |
|---|---|---|---|
| 5,587,620 A | 12/1996 | Ruby et al. | 310/346 |
| 5,596,239 A | 1/1997 | Dydyk | 310/311 |
| 5,617,065 A | 4/1997 | Dydyk | 333/186 |
| 5,630,949 A | 5/1997 | Lakin | 216/61 |
| 5,646,583 A | 7/1997 | Seabury et al. | 333/187 |
| 5,692,279 A * | 12/1997 | Mang et al. | 310/312 X |
| 5,698,928 A | 12/1997 | Mang et al. | 310/322 |
| 5,702,775 A | 12/1997 | Anderson et al. | 428/1 |
| 5,714,917 A | 2/1998 | Ella | 332/144 |
| 5,760,663 A | 6/1998 | Pradal | 333/187 |
| 5,780,713 A | 7/1998 | Ruby | 73/1.82 |
| 5,789,845 A * | 8/1998 | Wadaka et al. | 310/334 |
| 5,821,833 A | 10/1998 | Lakin | 333/187 |
| 5,853,601 A | 12/1998 | Krishaswamy et al. | 216/2 |
| 5,864,261 A | 1/1999 | Weber | 333/187 |
| 5,872,493 A * | 2/1999 | Ella | 333/191 |
| 5,873,153 A | 2/1999 | Ruby et al. | 29/25.35 |
| 5,873,154 A | 2/1999 | Ylilammi et al. | 29/25.35 |
| 5,883,575 A | 3/1999 | Ruby et al. | 340/572.5 |
| 5,884,378 A | 3/1999 | Dydyk | 29/25.35 |
| 5,894,647 A | 4/1999 | Lakin | 29/25.35 |
| 5,910,756 A * | 6/1999 | Ella | 333/189 X |
| 5,928,598 A | 7/1999 | Anderson et al. | 264/446 |
| 5,942,958 A * | 8/1999 | Lakin | 333/191 X |
| 5,963,856 A | 10/1999 | Kim | 455/307 |
| 6,051,907 A * | 4/2000 | Ylilammi | 310/312 |
| 6,060,818 A | 5/2000 | Ruby et al. | 310/363 |
| 6,081,171 A | 6/2000 | Ella | 333/189 |
| 6,087,198 A | 7/2000 | Panasik | 438/51 |
| 6,127,768 A | 10/2000 | Stoner et al. | 310/313 A |
| 6,150,703 A | 11/2000 | Cushman et al. | 257/415 |
| 6,185,589 B1 | 2/2001 | Votipka | 707/517 |
| 6,198,208 B1 | 3/2001 | Yano et al. | 310/358 |
| 6,201,457 B1 * | 3/2001 | Hickernell | 333/193 |
| 6,204,737 B1 | 3/2001 | Ella | 333/187 |
| 6,215,375 B1 | 4/2001 | Larson, III et al. | 333/187 |

* cited by examiner

THIN FILM RESONATOR FILTER HAVING AT LEAST ONE COMPONENT WITH DIFFERENT RESONANT FREQUENCY SETS OR ELECTRODE CAPACITANCE

FIELD OF THE INVENTION

The present invention relates to a thin film resonator, more particularly to a thin film resonator filter circuit.

DESCRIPTION OF THE RELATED ART

Thin film resonators (hereinafter "TFR") are typically used in high-frequency environments ranging from several hundred megahertz (MHz) to several gigahertz (GHz). FIG. 1 illustrates a side view of a conventional TFR component 100. In FIG. 1, TFR component 100 includes a piezoelectric material 110 interposed between two conductive electrode layers 105 and 115, with electrode layer 115 formed on a support structure 120. The support structure 120 may be a membrane, or may be a plurality of alternating reflecting layers on a solid semiconductor substrate which may be made of silicon or quartz, for example. The piezoelectric material is preferably one selected from the group comprising at least ZnO, CdS and AlN. Electrode layers 105 and 115 are formed from a conductive material, preferably of Al, but may be formed from other conductors as well.

These TFR components are often used in filters, more particularly in TFR filter circuits applicable to a myriad of communication technologies. For example, TFR filter circuits may be employed in cellular, wireless and fiber-optic communications, as well as in computer or computer-related information-exchange or information-sharing systems.

The desire to render these increasingly complicated communication systems portable and even hand-held place significant demands on filtering technology, particularly in the context of increasingly crowded radio frequency resources. TFR filters must meet strict performance requirements which include: (a) being extremely robust, (b) being readily mass-produced and (c) being able to sharply increase performance to size ratio achievable in a frequency range extending into the gigahertz region. However, in addition to meeting these requirements, there is a need for low passband insertion loss simultaneously coupled with demand for a relatively large stopband attenuation. Moreover, some of the typical applications noted above for these TFR filters require passband widths up to 4% of the center frequency (for example, for a center frequency of 2 GHz, the bandwidth required would be about 80 MHz. This is not easily achieved using common piezoelectrics such as AlN, especially in combination with a plurality of reflecting layers on a solidly mounted substrate.

A conventional electrical circuit model for these resonators is illustrated in FIG. 2A. The circuit model is a Butterworth-Van Dyke model (BVD), and is comprised of a series RLC line which represents the motional (acoustic) resonance of the TFR between an input terminal 10 and output terminal 20. The series RLC line is in parallel with a capacitor $C_O$ representing the parallel plate capacitance (static capacitance) of the electrodes (for example, electrodes 105 and 115 in FIG. 1)

Impedance analysis of the BVD model illustrated in FIG. 2A yields a set of two resonant frequencies, a zero resonant frequency ("zero") followed by a pole resonant frequency ("pole"). The separation of the zero from the pole is dependent on a piezoelectric acoustic coupling coefficient known as $K^2$. This coefficient is a measure of how much of the acoustic energy is coupled into electrical, and varies with the piezoelectric material used in the TFR. As will be explained later, attempting to emulate standard LC bandpass filter design techniques is difficult because each TFR in the filter has the two resonances (pole and zero), whereas there is only one resonance in standard LC bandpass filter branches for common filter responses such as a Chebychev response, for example. As will be discussed later, this "extra" resonance (either the pole or zero resonance, depending on the design of the TFR) is disadvantageous in that it somewhat interferes with the passband as wider passbands are attempted. However, if materials with a larger $K^2$ are used, this extra resonance will be farther away from the passband, which ultimately yields a wider bandwidth for the passband filter (the size of $K^2$ is directly related to the amount of separation between pole and zero resonances).

A standard approach to designing filters out of resonators is to arrange them in a ladder configuration in a series-shunt relationship (i.e., a "shunt" resonator connected in shunt at a terminal of a "series" resonator). Each of the shunt and series resonators has a pole resonance and a zero resonance. To achieve a bandpass filter response, it is necessary to shift the pole frequency of the shunt resonator down in frequency to align somewhat with the zero frequency of the series resonator. This shifting of shunt resonator pole frequencies down in an attempt to match the series resonator pole frequency is typically accomplished by adding some material (such as a metal, metal oxide, etc.) to the top electrode of the shunt resonator.

Currently, the conventional way of designing TFR ladder filters is to design simple building blocks of TFR components which are then concatenated together (connected or linked up in a series or chain). In a simplified view, concatenation helps to achieve a larger stopband attenuation for the overall filter because each individual linked up section in the chain successively filters the signal more as it passes through the chain. FIGS. 2B and 2C illustrate the simple building blocks, which are commonly known as T-Cells and L-Cells. Referring specifically to FIG. 2B, a T-Cell building block 125 includes three TFR components 130A, 130B and 135. TFR's 130A and 130B are "series arm" portions of the T-Cell block, being connected in series between an input port 132 and node 136, and node 136 to an output port 134 of T-Cell building block 125 respectively. Resonator element 135 comprises the "shunt leg" portion of T-Cell building block 125, being connected in shunt between terminal 136 and ground. Similarly in FIG. 2C, an L-section block 145 used in a conventional TFR filter circuit includes TFR 146 comprising the series arm portion, with a TFR 147 connected in shunt to TFR 146 at terminal 144 to ground.

FIG. 3 illustrates a conventional TFR filter circuit. The filter circuit of FIG. 3 is created by concatenation of four T-Cells 151–154. As discussed above, the chaining up of a plurality of T-Cells provides a filter with high stopband attenuation. Further, redundant series resonators may be combined in order to reduce the size of the filter, as illustrated in FIG. 5. In FIG. 5, redundant components are shown combined (as compared to FIG. 3, series arm TFR components 160 and 165 are effectively "pulled" (i.e., combined) together to form one TFR series component 175) in an effort to save space. Although the "inner" series branch electrode capacitances (see COS2 of TFR components 175, 180 and 185) in FIG. 5 are now different than the outer electrode capacitances (see COS of TFR components 190 and 195) because of the post-design combining, the "root" design is based on all of the series branch electrode capacitances being equal, and based on all the shunt branch electrode capacitances being equal, as illustrated in FIG. 3.

However, designing the filters illustrated in FIGS. 3 and 5 by the conventional concatenating approach has certain disadvantages. Namely, the filter designed by the above approach suffers poor flexibility in widening the passband width, as well as poor flatness performance when deviating from the center frequency. FIGS. 4A and 4B illustrate these effects in terms of insertion loss and return loss, as dB (y-axis) versus unit frequency (0.02 GHz/division, x-axis). FIG. 4A illustrates some common flatness and asymmetry problems. FIG. 4B illustrates common non-equiripple return loss.

FIGS. 6A and 6B illustrate the effects of using the conventional concatenation approach to widen bandwidth, depicting these effects in terms of insertion loss and return loss, as dB versus unit frequency. In order to attempt widening the bandwidth with the conventional concatenating approach, the shunt 5 resonator frequency set (pole and zero) must be shifted further apart from the series resonator frequency set. However, as the pole and zero resonant frequencies of the shunt resonator are shifted farther away from the series resonator frequencies, a "bump" quickly forms in the return loss response in the center of the band. This can be graphically shown in comparing FIGS. 4B and 6B at the center of the passband (1.96 GHz), where return loss changes from >30 dB to about 10 dB. This bump is an indicator of how well the filter is "unmatched" to 50 ohms (the standard for each T-cell building block in the filter), and the change in dB of the bump illustrates the drop off in impedance match. Moreover, because of the bump in the return loss response, a corresponding "dip" is formed in the insertion loss 15 response (see FIG. 6A). The primary reason for this is because all of the series resonators in the filter are resonant at the same frequencies, and all the shunt resonators in the filter are resonant at the same frequency.

Therefore, the conventional concatenation approach results in poor flatness performance and limited bandwidth. Although the filter formed by the concatenation approach is perfectly matched to 50 ohms at the center of the passband, the filter match deviates from 50 ohms more and more in approaching the edges of the passband and beyond into the stopband. Ideally, 50 ohm T-cell building blocks are concatenated in a proper manner only when they are matched adequately to 50 ohms over the entire band of interest. However, the concatenation approach shown in FIGS. 3 and 5 violate this principle by loading neighboring building blocks improperly as they deviate from the center of the passband, accounting for a less than ideal overall filter flatness performance and a pinching of the passband width.

Typically, when designing a filter as a whole, rather than by concatenating building blocks, a specific worst case return loss match performance is chosen. What typically happens is that the return loss (match) is better within the passband as compared to near the passband edges, where it falls off rapidly upon entering the stopband region. Furthermore, the filter is terminated by 50 ohm resistors on either side of it (which are 50 ohms regardless of frequency). In the case of concatenating several building blocks with similar match performance as above, each T-Cell would be terminating its neighboring T-Cell with a marginal return loss (match) near the passband edges, instead of a perfect 50 ohm match like at the center of the passband in the original case. Therefore, this phenomena tends to diminish the overall passband width for a given match performance criteria.

Accordingly, there is a need for a TFR filter circuit which can achieve better flatness performance in the passband, while achieving greater bandwidths.

SUMMARY OF THE INVENTION

The present invention provides a TFR filter circuit which may yield flatter passband responses and wider bandwidths as compared to those responses achieved by conventional TFR filter circuits. The TFR filter circuit has a plurality of TFR components arranged in a series branch-shunt branch relationship between input and output ports of the filter. Each of the TFR components in the series and shunt branches of the filter has a set of resonant frequencies, as well as a parallel plate electrode capacitance.

In one aspect, the present invention provides for the resonant frequency set of at least one TFR component in a series branch to be different from resonant frequency sets of other series branch TFR components in the circuit, and/or for the resonant frequency set of at least one TFR component in a shunt branch to be different from resonant frequency sets of other shunt branch TFR components in the circuit.

In another aspect, the present invention provides for the electrode capacitance of at least one TFR component in a series branch to be different from electrodes capacitances of other series branch TFR components in the circuit, and/or for the electrode capacitance of at least one TFR component in a shunt branch to be different from electrodes capacitances of other shunt branch TFR components in the circuit. The advantages of varying resonant frequency sets and/or electrode capacitance may enable wider bandwidth and improved flatness performance in the passband.

BRIEF DESCRIPTION OF THE DRAWINGS

The present invention will become fully understood from the detailed description given herein below and the accompanying drawings, wherein like elements represent like reference numerals, which are given by way of illustration only and thus are not limitative of the invention and wherein.

DETAILED DESCRIPTION

An embodiment of the present invention is directed to a thin film resonator (TFR) filter which provides maximum flexibility to improve performance in the passband. This may be achieved by allowing TFR resonant frequency sets to be individually varied so that the resonant frequency set of at least one TFR component in the series or shunt branch is different than resonant frequency sets of the other corresponding series and shunt TFR components in the series branch resonant frequency sets in the filter.

Alternatively, similar passband performance and bandwidth objectives may be obtained by varying parallel plate electrode capacitance of individual TFR components within the building blocks of the filter (T-Cells of L-Cells for example), so that the electrode capacitance of at least one TFR component in the series branch is different than other series branch electrode capacitances, and/or so that the electrode capacitance of at least one TFR component in the shunt branch is different than other shunt branch electrode capacitances in the filter.

These approaches are counter to the conventional concatenation approach, where sets of resonant frequencies in each of the series arms are equal to each other, and where sets of resonant frequencies in each of the shunt legs are equal to each other. Similarly, the present invention differs from conventional concatenation methods where capacitances in each TFR in respective series arms are equal to each other, and where capacitances in each TFR in respective shunt legs are equal to each other, as illustrated in the conventional root building block design of FIG. 3.

Figure 7:
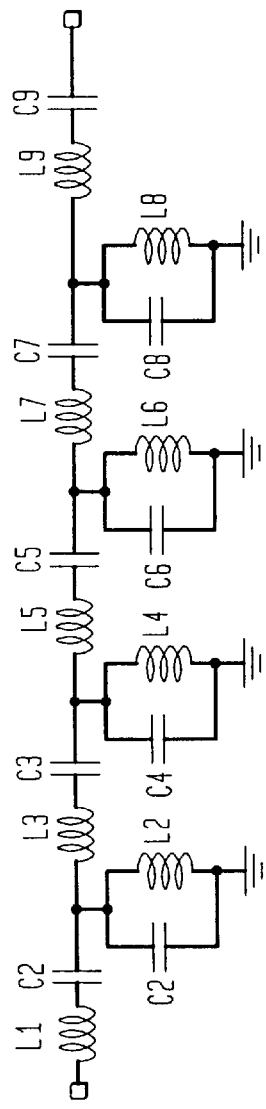
FIG. 7 illustrates a conventional LC filter circuit.

The basic approach leverages off of standard LC filter design, illustrated for example by the LC filter circuit of FIG. 7. For an LC filter, arbitrary bandwidths and passband shapes can be designed. Since there is no electrode capacitance to be concerned with in the standard LC filter, there is no "extra" or secondary resonant frequency created which in turn imposes bandwidth restrictions and degrades passband performance of the filter. Therefore, in the present invention, each individual TFR's resonant frequency set (pole and zero) is able to be varied, so as to best approximate the response of the standard LC filter in the passband while attempting to compensate for the response perturbance of the extra resonance.

Since the resonant frequencies are not forced by design to be equal, as is required by the conventional concatenation approach, the resonant frequency sets in the embodiment of the present invention may provide for an overall widening in passband width, as compared to what has been previously obtainable through the conventional concatenation approach. Similarly, electrode capacitances of individual TFR components in the TFR filter may be varied in value from each other in an effort to attain results similar to that attained by shifting resonant frequency sets. Since each TFR electrode capacitance is capable of being independently varied, the TFR filter circuit of the present invention can better approximate standard passband responses such as a Chebyshev response, for example.

Figure 3:
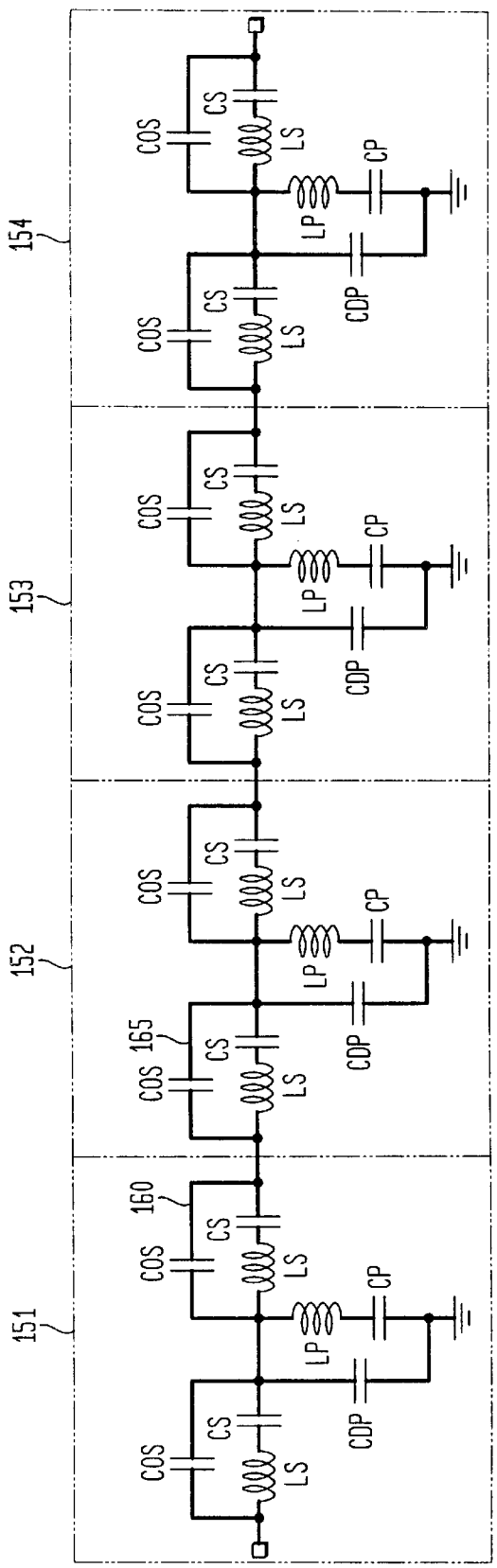
FIG. 3 illustrates a conventional TFR filter circuit.

As will be seen below, this translates to a more desirable "equi-ripple" (more even) response than is achieved by the conventional concatenating design approach, where all series branch resonant frequency sets are equal, all shunt branch resonant frequency sets are equal, and where all building block cells use equal series branch electrode capacitances, and equal shunt branch electrode capacitances. FIG. 3 illustrates such a T-cell TFR ladder filter circuit, which is formed by chaining together or concatenating a plurality of T-Cells. However, the present invention is not limited to such a structure, and is applicable to any shunt series, series-shunt or other structural arrangement of thin film resonators that form a bulk acoustic wave device such as a TFR filter.

Figure 1:
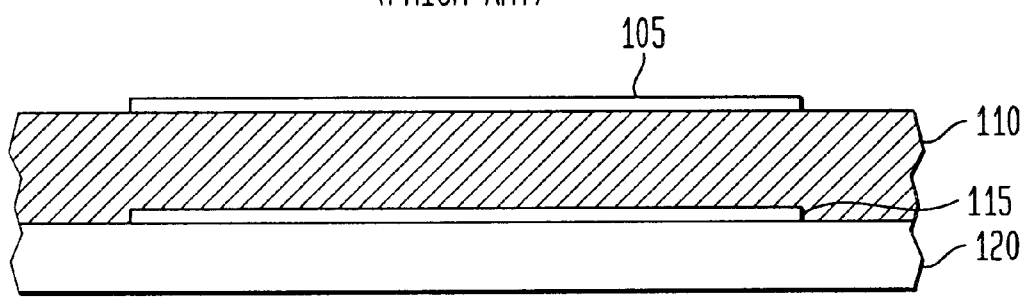
FIG. 1 is a side view of a conventional thin film resonator.
Figure 8:
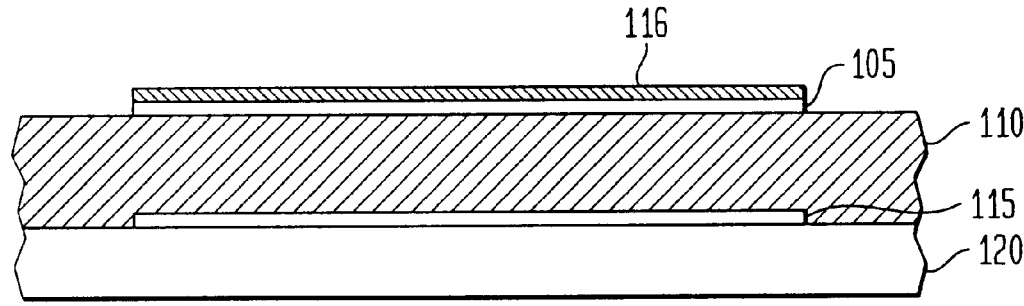
FIG. 8 is a side view of a TFR which has had its resonant frequency sets down-shifted.
Figure 2A:
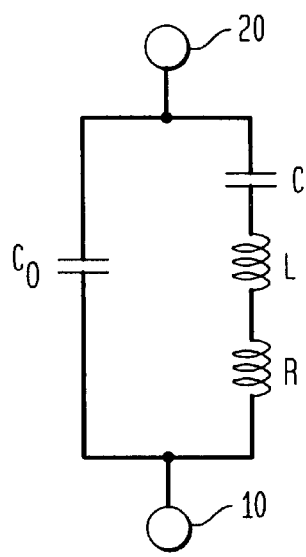
FIG. 2A illustrates a conventional BVD electrical circuit model for a TFR.
Figure 2B:
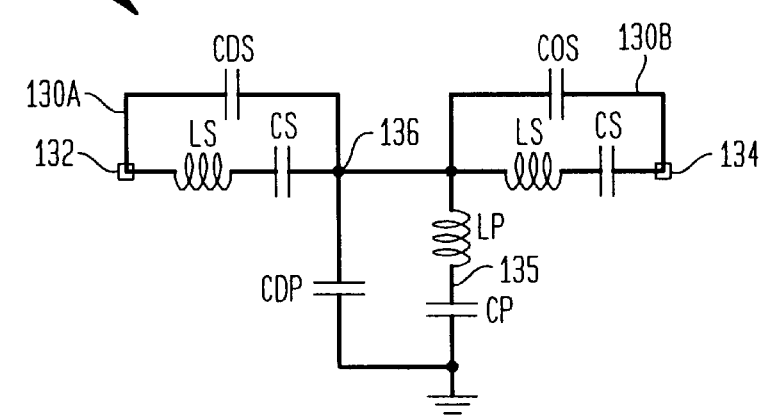
FIG. 2B illustrates a T-Cell block used in a conventional TFR filter circuit.
Figure 2C:
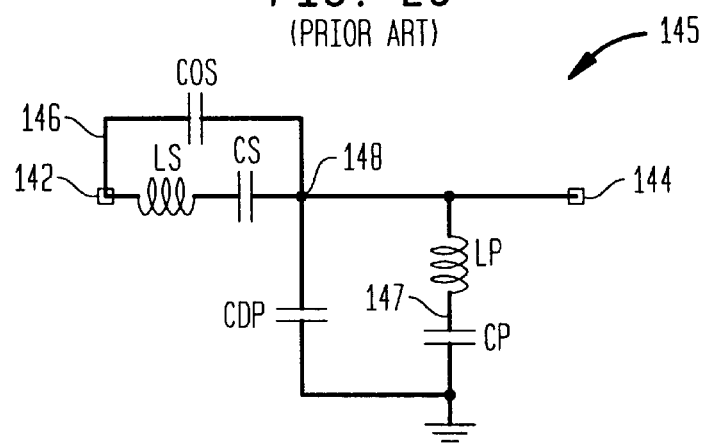
FIG. 2C illustrates an L-Cell block used in a conventional TFR filter circuit.

FIG. 8 illustrates how a TFR component's resonant frequency set can be down-shifted. Referring to FIG. 8, materials are added to the TFR 100 in the design phase (i.e., at time of manufacture) in an effort to shift the resonant frequency. For example, at time of manufacture a thin metal layer may be added to top electrode 105 to shift the resonant frequencies (pole and zero) of the TFR down in frequency. In FIG. 8, this is shown as thin metal layer 116 provided atop electrode 105.

Adding this metal layer increases the effective thickness of the TFR component. Since the resonant frequencies of a TFR component are dictated by the component's physical characteristics, this increased "thickness dimension" results in an increase in the wavelength of sound waves which resonate (i.e., are sustained) by in the TFR. Since wavelength is inversely proportional to frequency, this increased wavelength results in the shifting of resonant pole and zero frequencies of the shunt TFR component to a lower value. By designing each individual TFR with a different resonant frequency, (i.e., essentially shifting the resonant frequency set of each TFR in the filter), a TFR filter can be obtained which has a more uniform response in the passband as compared to TFR filters developed by conventional approaches.

Figure 9:
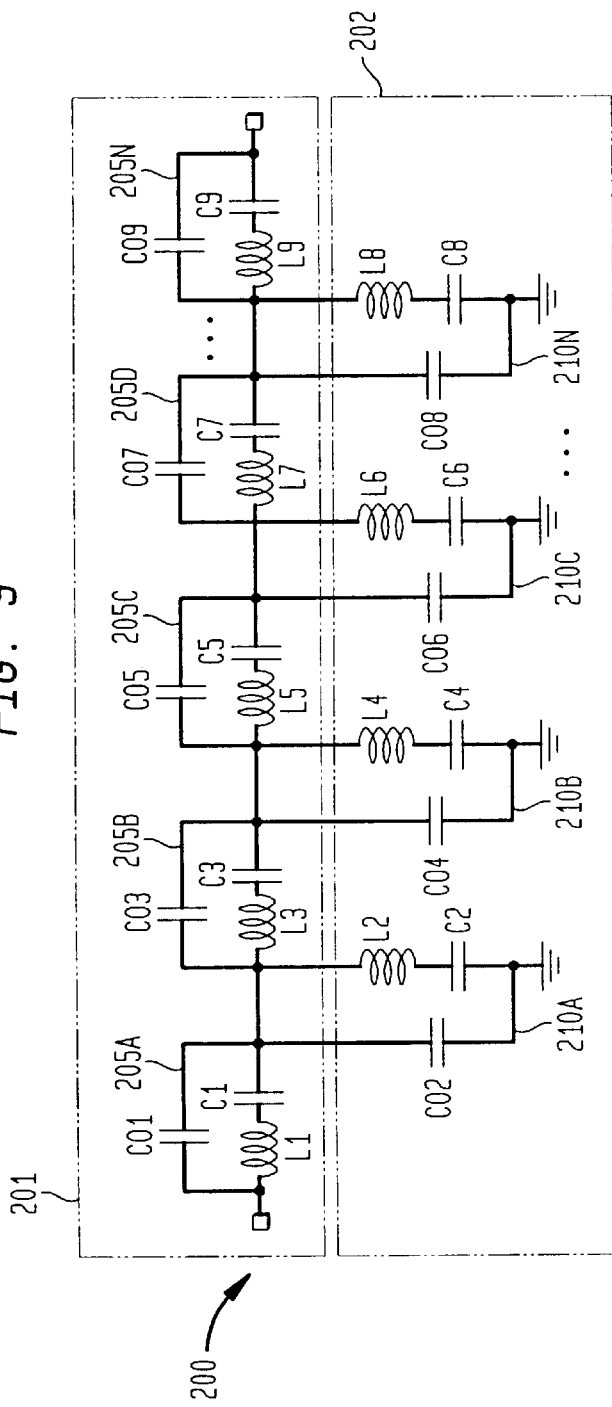
FIG. 9 illustrates the TFR filter circuit in accordance with the embodiment.

FIG. 9 illustrates a TFR filter circuit in accordance with the present invention, and is utilized to explain an alternative technique to achieve the desired bandpass response and filter bandwidth for a TFR filter. Referring to FIG. 9, the TFR filter circuit 200 comprises a plurality of series arms (designated by dotted line box 201), and a plurality of shunt legs (designated by dotted line box 202). These series arms 201 and shunt legs 202 include a plurality of TFR components (205A–N and 210A–N).

FIG. 9 illustrates that each of the series and shunt branch frequency sets and/or electrode capacitances may be varied independently from one another, and do not rely on the conventional root designs where all parameters in each of the series arms are equal to one another, and all parameters in each of the shunt legs are equal to one another. However, even though FIG. 9 does not reflect a concatenation of building block cells as in FIG. 3, for example, the present invention may be applied to building blocks as well, allowing for different parameters in each of the series and/or shunt branches of the filter.

As seen in FIG. 9, each electrode parallel plate capacitance is $CO_X$ is different. Whether one, several or all capacitance values (as shown) may be different from one another depends on the characteristics desired in the TFR filter. These capacitance values are varied by manipulating the surface area of the top and/or bottom electrodes of the TFR component. There is a direct relation between surface area of the electrode and capacitance—the larger the surface area, the larger the capacitance value. Thus, an acceptable bandpass response and filter bandwidth may be achieved simply by independently enlarging or reducing the surface area of the electrodes of one, several, or each of the TFR components which constitute the TFR filter. Additionally as shown in FIG. 9, the resonant branches are represented by LxCx. Whether one, several or all of the LxCx branches are independently varied depends on the characteristics desired in the TFR filter. These resonant branches determine the resonant frequency sets of the TFR's and may preferably be varied by changing the effective acoustic thickness as outlined above.

Figure 4A:
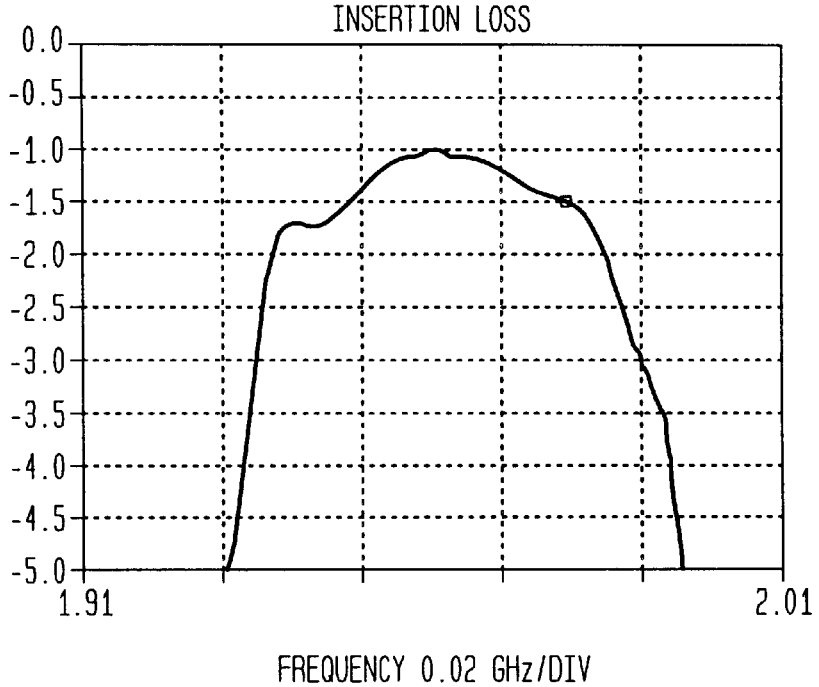
FIG. 4A illustrates a passband insertion loss performance of the TFR filter circuit depicted in FIG. 3.
Figure 4B:
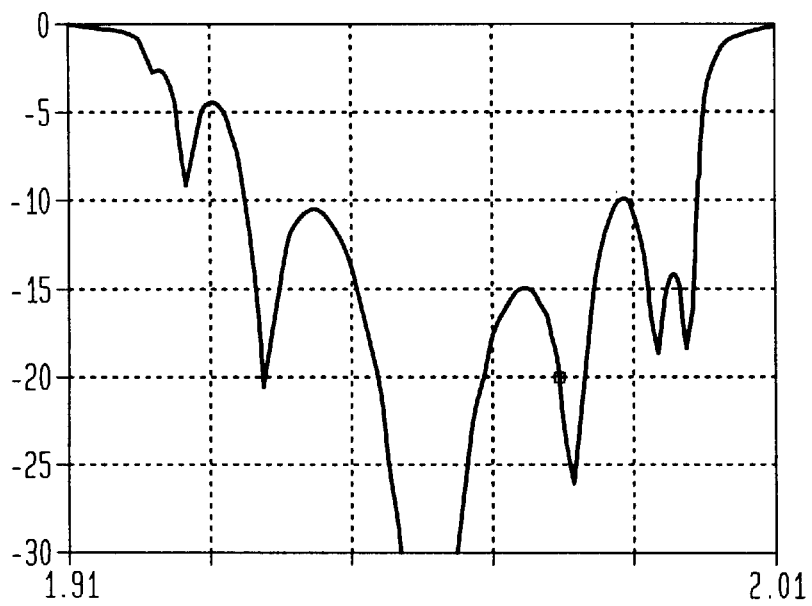
FIG. 4B depicts the return loss performance of a TFR filter circuit depicted in FIG. 3.
Figure 5:
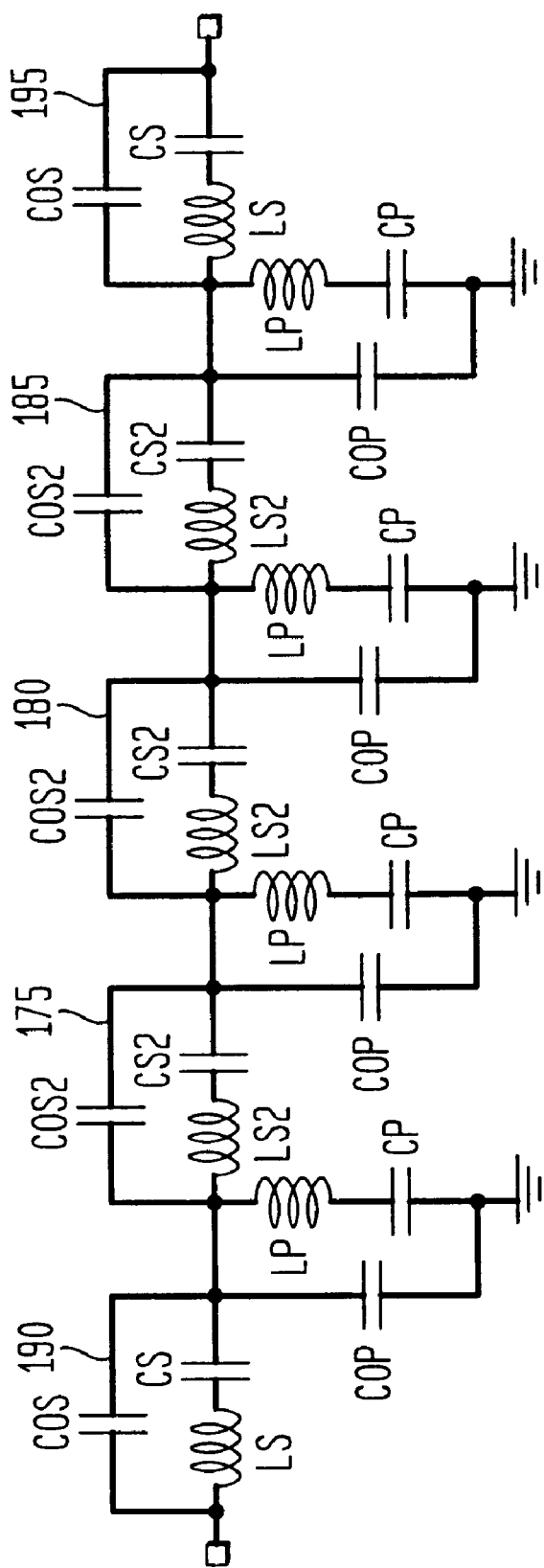
FIG. 5 illustrates a TFR filter circuit similar to FIG. 3, but which combines redundant series arm neighbors of the conventional root design.
Figure 6A:
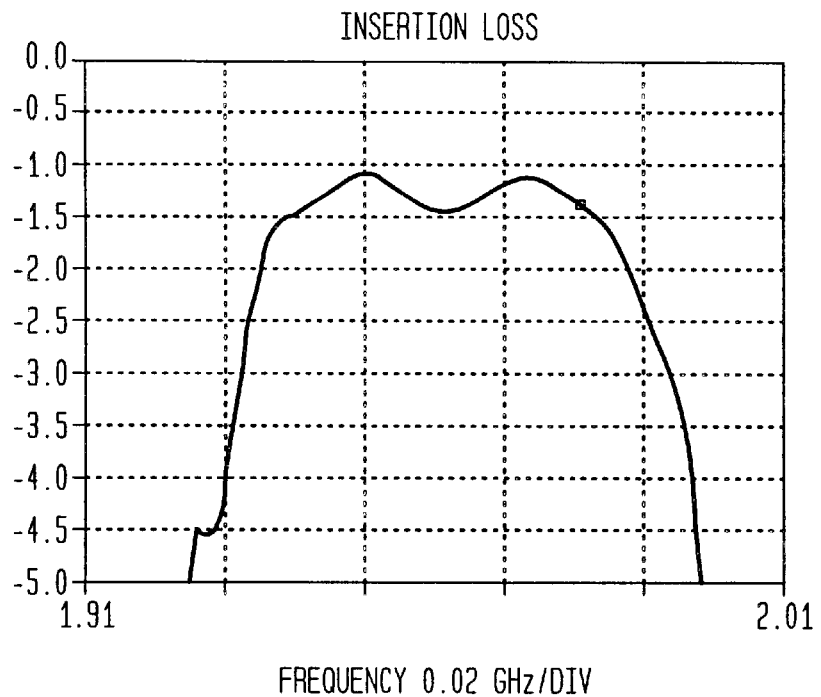
FIG. 6A illustrates the passband insertion loss performance of the TFR filter circuit depicted in FIG. 3 after a further shifting apart of the shunt legs set of resonant frequencies.
Figure 6B:
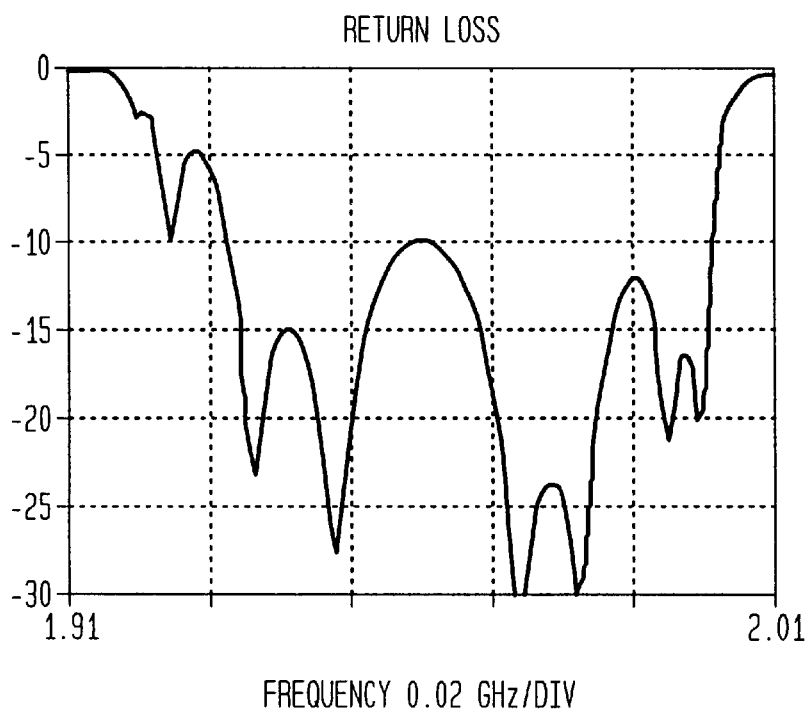
FIG. 6B illustrates the return loss performance of the TFR filter circuit depicted in FIG. 3 after a further shifting apart of the shunt legs set of resonant frequencies.
Figure 10A:
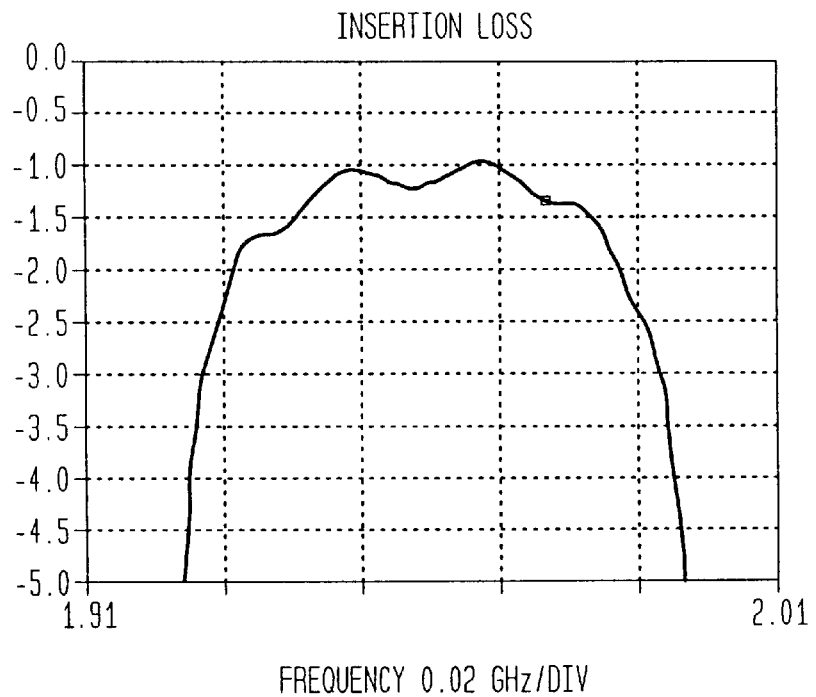
FIG. 10A depicts the passband performance of the TFR filter circuit illustrated in FIG. 9.
Figure 10B:
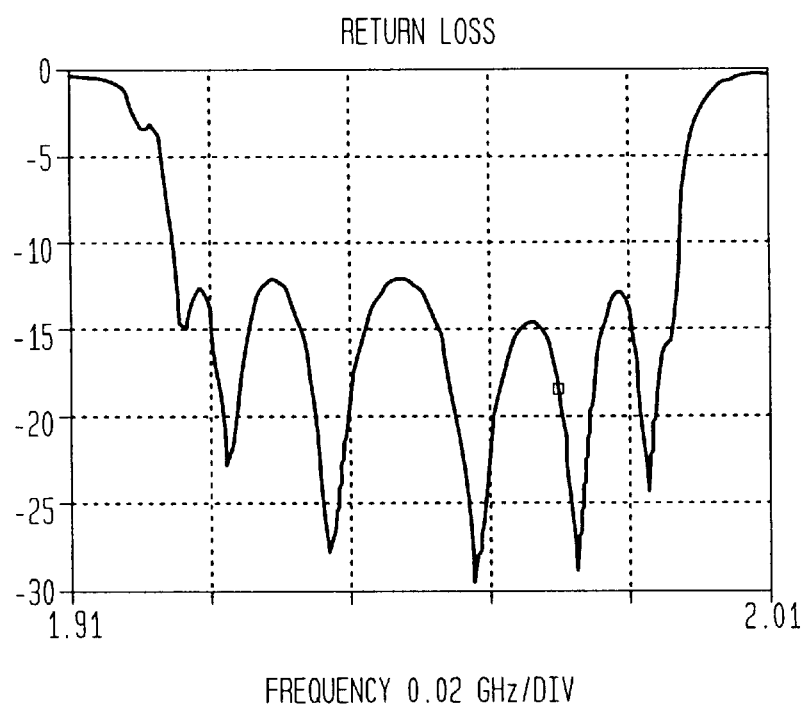
FIG. 10B depicts a return loss performance of the TFR filter circuit illustrated in FIG. 9.

FIGS. 10A and 10B depict the passband and return loss performance of the TFR filter circuit in accordance with the present invention. A comparison of FIGS. 10A and 10B with the passband responses of the conventional TFR filter circuit (see FIGS. 4A, 4B, 6A and 6B) show a marked difference. As illustrated in FIG. 10B, the return loss is more equi-ripple within the passband (see between 1.93 and 1.99 GHz) as compared to either of FIGS. 4B or 6B. This in turn yields a flatter passband insertion loss (see FIG. 10A) and wider bandwidth for a given minimum return loss level. Specifically, the bandwidth in FIG. 10A is about 3.7 divisions (or 74 MHz), as compared to FIG. 6A (approximately 3.5 divisions or 70 MHz) and FIG. 4A (approximately 3.3 divisions or 66 MHz).

Therefore, the TFR filter of present invention provides for a more uniform response in the passband and enables wider bandwidth improvements for a given amount of minimum return loss in the passband as compared to conventional TFR circuits. This is done by independently shifting resonant frequency sets of the TFR components, or alternatively by independently varying the electrode capacitance of TFR components, or by performing both shifting of resonant frequency sets and varying capacitance of respective TFR components. Furthermore, the filter circuit design of the present invention departs from conventional building block structures currently used in designing TFR filter circuits, where all series branch TFR component resonant frequency sets and electrode capacitances are equal, and where all shunt branch TFR component resonant frequency sets and electrode capacitances are equal.

The invention being thus described, it will be obvious that the same may be varied in many ways. For example, the filter structure is not limited to the chaining up of T-Cells or L-Cells of TFR components; any series-shunt and/or shunt-series alternating arrangement, or any other arrangement of thin film resonators between input and output ports may be employed in the structure of the filter. Additionally, although the invention has been described by utilizing either the shifting of resonant frequency sets or the varying of parallel plate electrode capacitance, both techniques may be used in concert to achieve desired results. Such variations are not to be regarded as a departure from the spirit and scope of the invention, and also to modifications as would be obvious to one skilled in the art or intended to be included within the scope of the following claims.

What is claimed is:

1. A thin film resonator (TFR) filter, comprising:
   a plurality of TFR components forming a plurality of series and shunt branches between an input port and an output port,
      wherein each of said plurality of TFR components has a set of resonant frequencies,
      wherein a resonant frequency set composed of a resonant pole frequency and a resonant zero frequency of at least one TFR component in at least one of said series or shunt branches is different from resonant frequency sets of the other corresponding series and shunt branch TFR components in the filter, and
      wherein the TFR filter is configured to achieve a uniform response in the passband and wider bandwidth for a given amount of return loss by shifting the resonant frequency set of said at least one TFR component in said at least one said series or shunt branches at time of manufacture of the TFR filter.

2. The filter of claim 1, wherein each of said plurality of TFR components in said plurality of series branches has a different set of resonant frequencies.

3. The filter of claim 1, wherein each of said plurality of TFR components in said plurality of shunt branches has a different set of resonant frequencies.

4. A method of designing a thin film resonator (TFR) filter, comprising:
   coupling a plurality of TFR components to form series and shunt branches between an input port and an output port, wherein each of said plurality of TFR components has a set of resonant frequencies; and
   shifting a set of resonant frequencies, each set composed of a resonant pole frequency and a resonant zero frequency, of at least one TFR component in at least one of said series or shunt branches, said shifted resonant frequency set being different from resonant frequency sets of the other corresponding series and shunt branch TFR components in the filter,
      wherein the TFR filter is configured to achieve a uniform response in the passband and wider bandwidth for a given amount of return loss by shifting the resonant frequency set of said at least one TFR component in said at least one said series or shunt branches at time of manufacture of the TFR filter.

5. The method of claim 4, wherein said step of shifting includes shifting resonant frequency sets for each of said plurality of TFR components in said series branches so that each series branch TFR component has a different set of resonant frequencies.

6. The method of claim 4, wherein said step of shifting includes shifting resonant frequency sets for each of said plurality of TFR components in said shunt branches so that each shunt branch TFR component has a different set of resonant frequencies.

7. A thin film resonator (TFR) filter, comprising:
   a plurality of TFR components forming a plurality of series and shunt branches between an input port and an output port,
      wherein each of said plurality of TFR components has an electrode capacitance,
      wherein a electrode capacitance of at least one TFR component in at least one of said series or shunt branches is different from electrode capacitances of the other corresponding series and shunt branch TFR components in the filter, and
      wherein the TFR filter is configured to achieve a uniform response in the passband and wider bandwidth for a given amount of return loss by setting the electrode capacitance of said at least one TFR component in said at least one said series or shunt branches to a desired value at time of manufacture of the TFR filter.

8. The filter of claim 7, wherein each of said TFR components in said plurality of series branches has a different electrode capacitance.

9. The filter of claim 7, wherein each of said TFR components in said plurality of shunt branches has a different electrode capacitance.

10. A method of designing a thin film resonator (TFR) filter, comprising:
    coupling a plurality of TFR components to form series and shunt branches between an input port and an output port, wherein each of said plurality of TFR components has an electrode capacitance; and
    varying an electrode capacitance of at least one of said TFR components in at least one of said series or shunt branches, said varied electrode capacitance being different from electrode capacitances of the other corresponding series and shunt branch TFR components in the filter, wherein the TFR filter is configured to achieve a uniform response in the passband and wider bandwidth for a given amount of return loss by varying the electrode capacitance of said at least one TFR component in said at least one said series or shunt branches so as to be set to a desired value at time of manufacture of the TFR filter.

11. The method of claim 10, wherein said step of varying further includes varying each of said plurality of TFR components in said series branches so that each series branch TFR component has a different electrode capacitance.

12. The method of claim 10, wherein said step of varying further includes varying each of said plurality of TFR components in said shunt branches so that each shunt branch TFR component has a different electrode capacitance.

13. A thin film resonator (TFR) filter, comprising:

a plurality of TFR components forming a plurality of series and shunt branches between an input port and an output port, each TFR component having a set of resonant frequencies composed of a resonant pole frequency and a resonant zero frequency and each having an electrode capacitance, wherein an electrode capacitance of at least one TFR component in at least one of said series or shunt branches is different from electrode capacitances of the other corresponding series and shunt branch TFR components in the filter;

wherein a resonant frequency set of at least one TFR component in at least one of said series and shunt branches is different from resonant frequency sets of the other corresponding series and shunt branch TFR components in the filter, and wherein the TFR filter is configured to achieve a uniform response in the passband and wider bandwidth for a given amount of return loss by shifting the resonant frequency set of said at least one TFR component and by setting the electrode capacitance of said at least one TFR component in said at least one said series or shunt branches to desired values at time of manufacture of the TFR filter.

14. The filter of claim 13, wherein each of said plurality of TFR components in said plurality of series branches has a different set of resonant frequencies.

15. The filter of claim 13, wherein each of said plurality of TFR components in said plurality of shunt branches has a different set of resonant frequencies.

16. The filter of claim 13, wherein each of said plurality of TFR components in said plurality of series branches has a different electrode capacitance.

17. The filter of claim 13, wherein each of said plurality of TFR components in said plurality of shunt branches has a different electrode capacitance.

18. A method of designing a thin film resonator (TFR) filter, comprising:

coupling a plurality of TFR components to form series and shunt branches between an input port and an output port, wherein each of said plurality of TFR components has an electrode capacitance and a set of resonant frequencies composed of a resonant pole frequency and a resonant zero frequency;

shifting a set of resonant frequencies of at least one TFR component in at least one of said series or shunt branches, said shifted resonant frequency set being different from resonant frequency sets of the other corresponding series and shunt branch TFR components in the filter; and varying an electrode capacitance of at least one of said TFR components in at least one of said series and shunt branches, said varied electrode capacitance being different from electrode capacitances of the other corresponding series and shunt branch TFR components in the filter, wherein the TFR filter is configured to achieve a uniform response in the passband and wider bandwidth for a given amount of return loss by shifting the resonant frequency set of said at least one TFR component and by varying the electrode capacitance of said at least one TFR component in said at least one said series or shunt branches to desired values at time of manufacture of the TFR filter.

19. The method of claim 18, wherein said step of shifting includes shifting resonant frequency sets for each of said plurality of TFR components in said series branches, so that each series branch TFR component has a different set of resonant frequencies.

20. The method of claim 18, wherein said step of shifting includes shifting resonant frequency sets for each of said plurality of TFR components in said shunt branches, so that each shunt branch TFR component has a different set of resonant frequencies.

21. The method of claim 18, wherein said step of varying further includes varying each of said plurality of TFR components in said series branches so that each series branch TFR component has a different electrode capacitance.

22. The method of claim 18, wherein said step of varying further includes varying each of said plurality of TFR components in said shunt branches so that each shunt branch TFR component has a different electrode capacitance.

23. A thin film resonator (TFR) filter formed from a plurality of TFR components, each of said plurality of TFR components having a set of resonant frequencies and arranged in a plurality of series and shunt branches between an input port and an output port, wherein a resonant frequency set of at least one TFR component in at least one of said series and/or shunt branches is different from resonant frequency sets of the other corresponding series and shunt branch TFR components in the filter, and wherein the TFR filter is configured to achieve a uniform response in the passband and wider bandwidth for a given amount of return loss by shifting the resonant frequency set of said at least one TFR component in said at least one said series or shunt branches at time of manufacture of the TFR filter.

24. A thin film resonator (TFR) filter formed from a plurality of TFR components, each of said plurality of TFR components having an electrode capacitance and arranged in a plurality of series and shunt branches between an input port and an output port, wherein an electrode capacitance of at least one TFR component in at least one of said series and/or shunt branches is different from electrode capacitances of the other corresponding series and shunt branch TFR components in the filter, and wherein the TFR filter is configured to achieve a uniform response in the passband and wider bandwidth for a given amount of return loss by setting the electrode capacitance of said at least one TFR component in said at least one said series or shunt branches to a desired value at time of manufacture of the TFR filter.

* * * * *